United States Patent
Izumida et al.

(10) Patent No.: US 8,614,477 B2
(45) Date of Patent: Dec. 24, 2013

(54) NONVOLATILE SEMICONDUCTOR MEMORY DEVICE

(75) Inventors: Takashi Izumida, Kanagawa-ken (JP); Nobutoshi Aoki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 21 days.

(21) Appl. No.: 13/364,588

(22) Filed: Feb. 2, 2012

(65) Prior Publication Data
US 2012/0146128 A1 Jun. 14, 2012

Related U.S. Application Data

(62) Division of application No. 12/618,119, filed on Nov. 13, 2009, now Pat. No. 8,134,203.

(30) Foreign Application Priority Data

Nov. 18, 2008 (JP) .................................. 2008-294786

(51) Int. Cl.
*H01L 29/788* (2006.01)
*H01L 29/792* (2006.01)

(52) U.S. Cl.
USPC ........ 257/326; 257/314; 257/315; 257/E29.3; 257/E29.309

(58) Field of Classification Search
USPC .................. 257/314, 315, 321, 326, E29.129, 257/E29.304, E29.309
See application file for complete search history.

(56) References Cited

U.S. PATENT DOCUMENTS

| | | | | |
|---|---|---|---|---|
| 4,385,308 A | * | 5/1983 | Uchida ........................ | 257/326 |
| 5,838,041 A | * | 11/1998 | Sakagami et al. ............ | 257/324 |
| 6,512,263 B1 | * | 1/2003 | Yuan et al. ................... | 257/316 |
| 6,897,522 B2 | * | 5/2005 | Harari et al. ................. | 257/324 |
| 6,903,422 B2 | | 6/2005 | Goda et al. | |
| 7,342,279 B2 | * | 3/2008 | Harari et al. ................. | 257/324 |
| 7,479,677 B2 | * | 1/2009 | Harari et al. ................. | 257/324 |

(Continued)

FOREIGN PATENT DOCUMENTS

| | | |
|---|---|---|
| JP | 2000-286349 | 10/2000 |
| JP | 2003-51559 | 2/2003 |
| JP | 2004-39866 | 2/2004 |
| JP | 2008-270774 | 11/2008 |

OTHER PUBLICATIONS

Japanese Office Action dated Aug. 2, 2013, in Japanese Patent Application No. 2008-294786 filed Nov. 18, 2008 (with English Translation).

*Primary Examiner* — Victor A Mandala
(74) *Attorney, Agent, or Firm* — Oblon, Spivak, McClelland, Maier & Neustadt, L.L.P.

(57) ABSTRACT

In a nonvolatile semiconductor memory device provided with memory cell transistors arranged in a direction and a select transistor to select the memory cell transistors, each of the memory cell transistors of a charge trap type are at least composed of a first insulating layer and a first gate electrode respectively, and the select transistor is at least composed of a second insulating layer and a second gate electrode. The first gate electrode is provided with a first silicide layer of a first width formed on the first insulating layer. The second gate electrode is provided with an impurity-doped silicon layer formed on the second insulating layer and with a second silicide layer of a second width formed on the impurity-doped silicon layer. The second silicide has the same composition as the first silicide. The second width is larger than the first width.

3 Claims, 12 Drawing Sheets

(56) References Cited

U.S. PATENT DOCUMENTS 7,829,938 B2 * 11/2010 Bhattacharyya .............. 257/325
7,834,392 B2 * 11/2010 Harari et al. .................. 257/324

2007/0045716 A1 * 3/2007 Chen et al. .................... 257/324
2008/0179654 A1    7/2008 Sato et al.
2009/0121275 A1 * 5/2009 Kim et al. ..................... 257/321

* cited by examiner

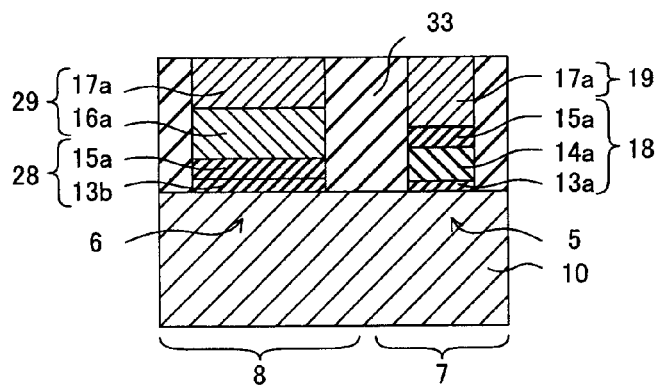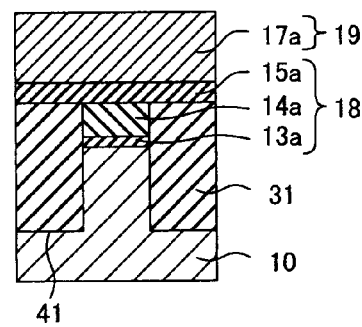
FIG.9A  FIG.9B
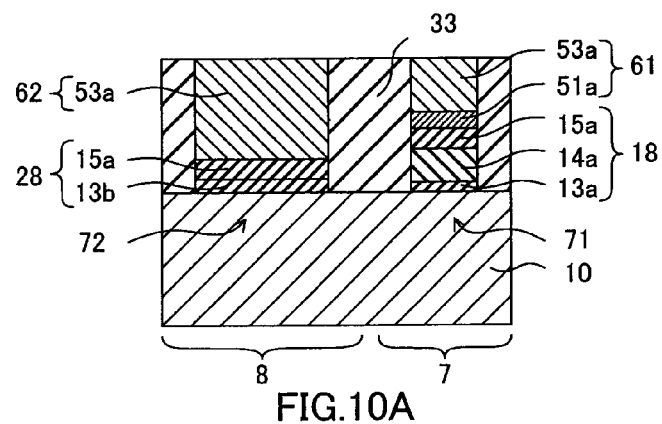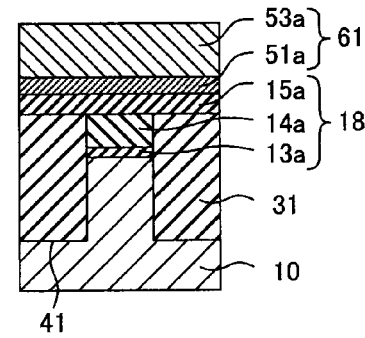
FIG.10A  FIG.10B

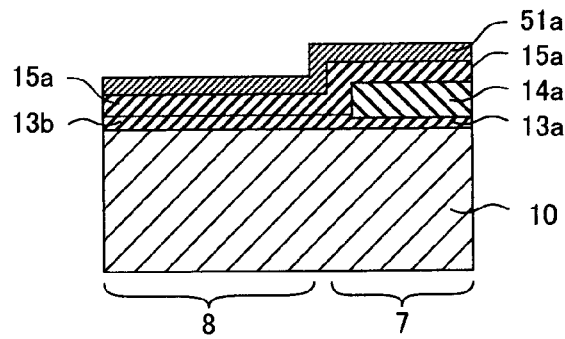 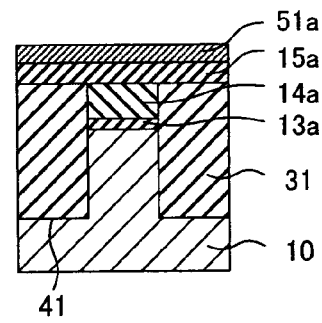
FIG.11A      FIG.11B
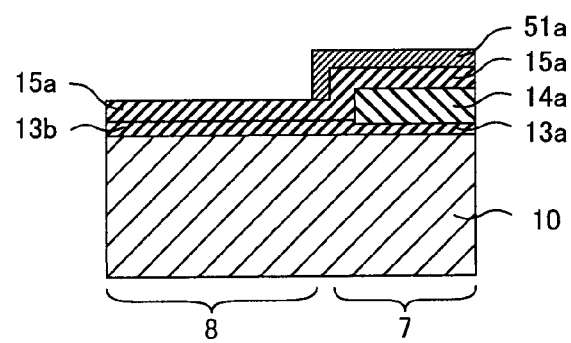 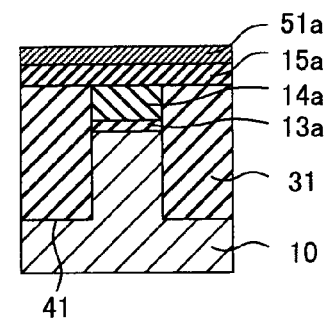
FIG.12A      FIG.12B
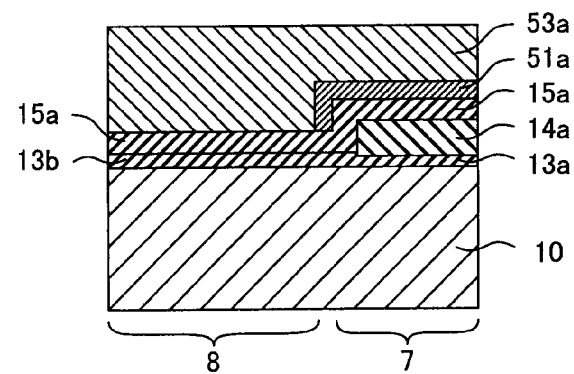 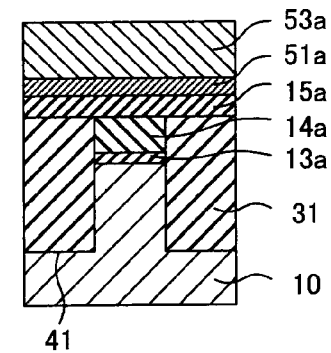
FIG.13A      FIG.13B

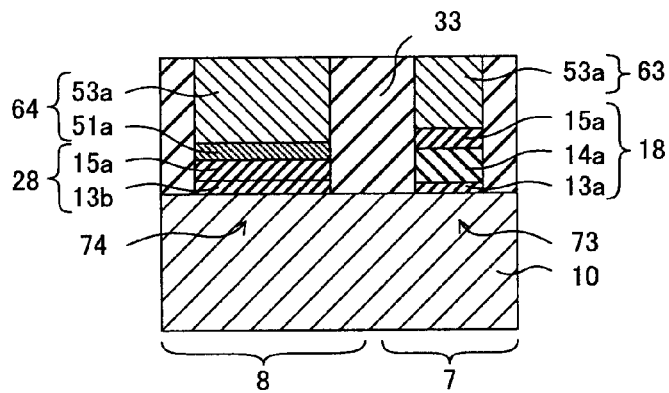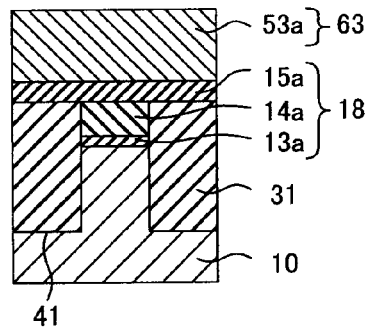
FIG.14A   FIG.14B
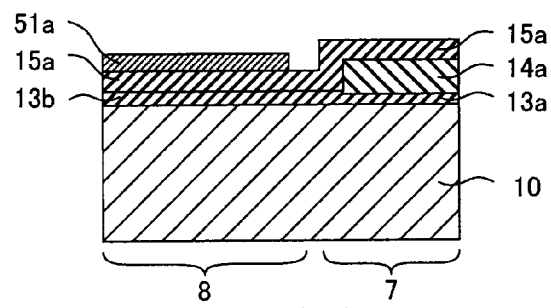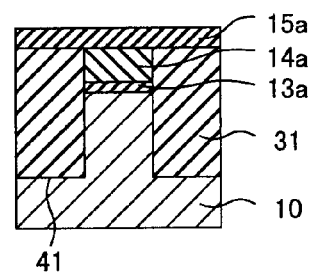
FIG.15A   FIG.15B
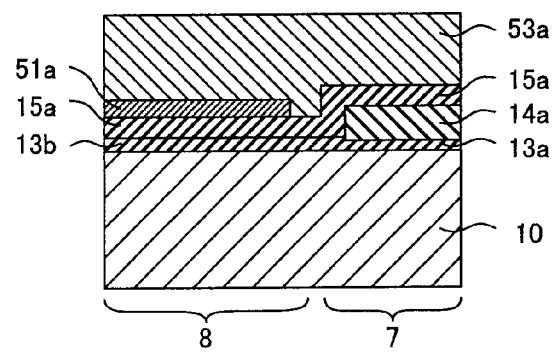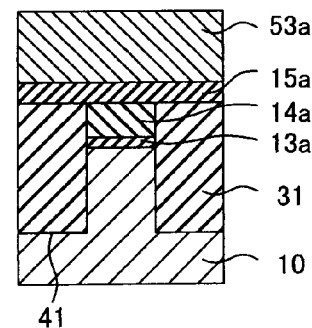
FIG.16A   FIG.16B

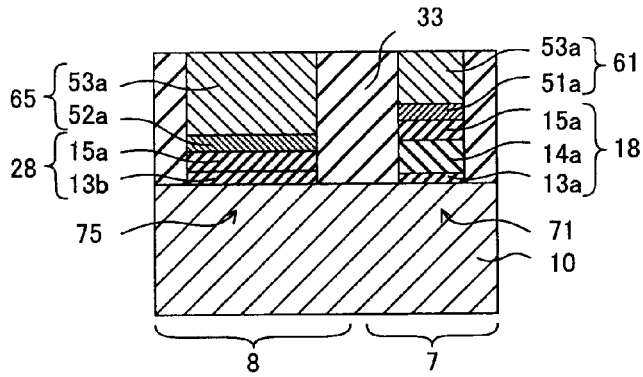
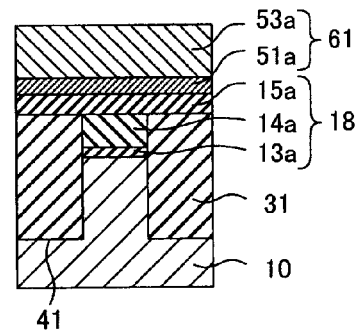
FIG.17A
FIG.17B
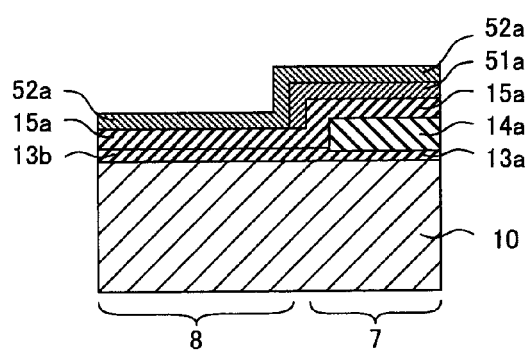
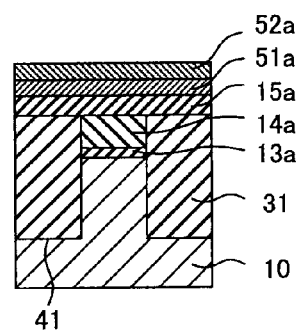
FIG.18A
FIG.18B
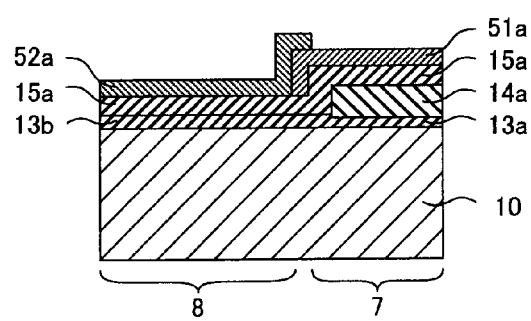
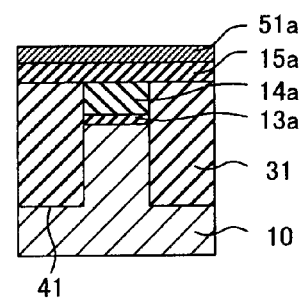
FIG.19A
FIG.19B

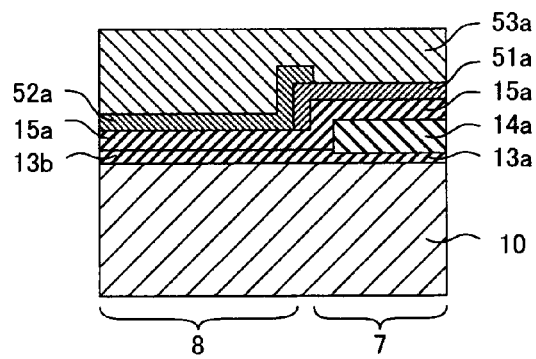
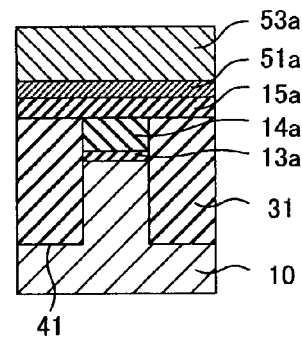
FIG.20A   FIG.20B
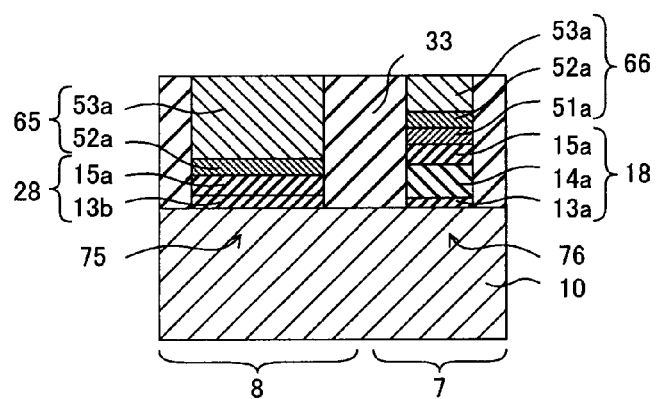
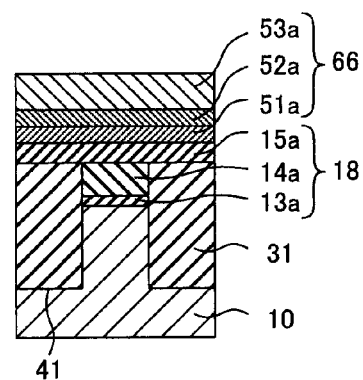
FIG.21A   FIG.21B
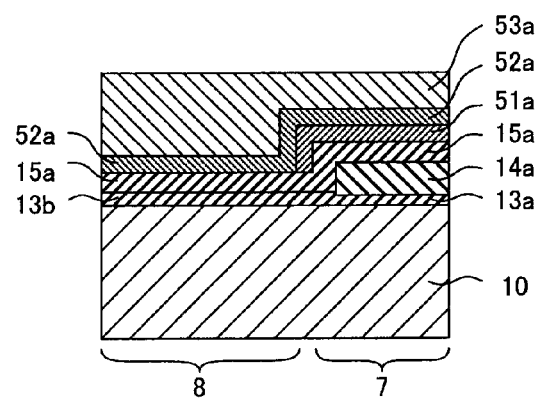
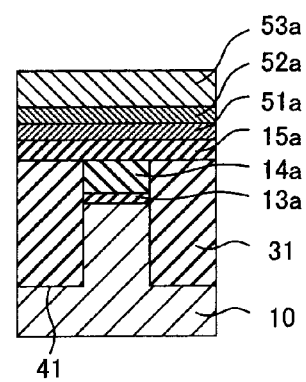
FIG.22A   FIG.22B

NONVOLATILE SEMICONDUCTOR MEMORY DEVICE

CROSS REFERENCE TO RELATED APPLICATION

This application is a divisional of U.S. application Ser. No. 12/618,119, filed Nov. 13, 2009, now U.S. Pat. No. 8,134,203 and is based upon and claims the benefit of priority from the prior Japanese Patent Application No. 2008-294786, filed on Nov. 18, 2008; the entire contents of each of which are incorporated herein by reference

BACKGROUND

A memory cell of a nonvolatile semiconductor memory device has a transistor structure in which a gate insulating layer and a control gate electrode are deposited on a semiconductor substrate. Writing/erasing is performed for the memory cell by applying a voltage between the control gate electrode and the substrate to cause a tunneling current to flow, and by controlling a threshold voltage in accordance with charge amount in a charge storage layer. Examples of the structure of the memory cell include a metal-oxide-nitride-oxide-silicon (MONOS) structure and a stack gate structure.

The MONOS structure and the like are also referred to as a charge trap type. The charge trap type is formed by sequentially depositing, for example, a tunneling insulating layer (silicon oxide layer) as a gate insulating layer to selectively pass charges through, a charge storage insulating layer (silicon nitride layer), and a blocking insulating layer (silicon oxide layer) to block a current between the charge storage insulating layer and the control gate electrode. The charge trap type changes a threshold by trapping charges into trap sites locally existing in the silicon nitride layer.

The stack gate structure is also referred to as a floating gate type. The floating gate type is formed by sequentially depositing a tunneling insulating layer (silicon oxide layer), a floating gate electrode (polysilicon layer), an intergate insulating layer (ONO layer), and a control gate electrode, for example. Writing/erasing is performed by applying a high voltage between the control gate electrode and the semiconductor substrate to cause an FN (Fowler-Nordheim) tunneling current to flow, and by transferring charges between the tunneling insulating layer and the floating gate electrode. In other words, data is stored by controlling a threshold voltage in accordance with the charge amount within the floating gate electrode.

A memory cell of each of these types is selected by a select transistor adjacent to the memory cell. The select transistor does not need to continue storing charges. In the select transistor, for example, a gate insulating layer (silicon oxide layer) and a control gate electrode (polysilicon layer) are sequentially deposited.

It is important that a threshold voltage of the memory cell transistor and that of the select transistor should be within tolerance.

Japanese Patent Application Publication No. 2008-159614 discloses a floating gate type structure as follows. A memory cell transistor includes a floating gate electrode, an intergate insulating layer formed on the floating gate electrode, and a control gate electrode formed on the intergate insulating layer. A select transistor includes a lower side gate electrode, an intergate insulating layer formed on the lower side gate electrode and having an opening, a blocking layer formed at least in the opening and having a function to block diffusion of metal atoms, and an upper side gate electrode formed on a second intergate insulating layer and electrically connected to the lower side gate electrode through the blocking layer. The control gate electrode of the memory cell transistor and the upper side gate electrode of the select transistor are fully silicided.

The disclosed floating gate type has a configuration in which the lower gate electrode of the select transistor has polysilicon left unsilicided, and the control gate electrode of the memory cell transistor is fully silicided. The gate electrodes of the memory cell transistor and the select transistor can have work functions different from each other. The floating gate type makes use of the configuration in which these gate electrodes share the intergate insulating layer and in which the select transistor has the opening in the intergate insulating layer.

However, the charge trap type has no structure in which the intergate insulating layer is formed. Accordingly, it is difficult to directly apply the disclosed technique of the stack gate structure to the charge trap type. Additionally, the disclosed technique has no option but to control a threshold voltage by leaving polysilicon unsilicided in the lower side gate electrode of the select transistor, and thus has difficulty in employing another configuration.

SUMMARY

One aspect of the invention is to provide a nonvolatile semiconductor memory device that may comprise a semiconductor substrate, a plurality of memory cell transistors, each of the memory cell transistors having a first insulating layer and a first gate electrode, the first insulating layer including a charge storage insulating layer formed on the semiconductor substrate, the first gate electrode being formed on the first insulating layer, and a select transistor having a second insulating layer and a second gate electrode, the second insulating layer being formed on the semiconductor substrate, the second gate electrode being formed on the second insulating layer, wherein the first gate electrode is provided with a first silicide layer of a first width, the second gate electrode is provided with a impurity-doped silicon layer and a second silicide layer of a second width formed on the impurity-doped silicon layer, and the second width is larger than the first width.

Another aspect of the invention is to provide a nonvolatile semiconductor memory device that may comprise a semiconductor substrate, a plurality of memory cell transistors, each of the memory cell transistors having a first insulating layer and a first gate electrode, the first insulating layer including a charge storage insulating layer formed on the semiconductor substrate, the first gate electrode being formed on the first insulating layer, and a select transistor having a second insulating layer and a second gate electrode, the second insulating layer being formed on the semiconductor substrate, the second gate electrode being formed on the second insulating layer, wherein the first gate electrode is provided with a first material selected from impurity-doped silicon materials and metallic conductive materials, and the second gate electrode is provided with a second material selected from the impurity-doped silicon materials and the metallic conductive materials, the second material being different from the first material.

Another aspect of the invention is to provide a nonvolatile semiconductor memory device that may comprise a semiconductor substrate, a plurality of column-shaped semiconductor portions being formed on the semiconductor substrate nearly perpendicular to the semiconductor substrate, a plurality of memory cell transistors, each of the memory cell transistors having a first insulating layer and a first gate electrode, the first insulating layer being formed on a surface of each of the column-shaped semiconductor portions and including a charge storage insulating layer, the first gate electrode being formed on a surface of the first insulating layer, and a select transistor having a second insulating layer and a second gate electrode, the second insulating layer being formed on a surface of each of the column-shaped semiconductor portion and adjacent to the first insulating layer, the second gate electrode being formed on a surface of the second insulating layer, wherein the first gate electrode is provided with a first material selected from impurity-doped silicon materials and metallic conductive materials, and the second gate electrode is provided with a second material selected from the impurity-doped silicon materials and the metallic conductive materials, the second material being different from the first material.

BRIEF DESCRIPTION OF THE DRAWINGS

FIG. 2A to FIG. 9A are sectional views showing a process of a method for manufacturing the nonvolatile semiconductor memory device according to the first embodiment, corresponding to an area of a long dashed double-dotted line in FIG. 1B.

FIG. 2B to FIG. 9B are sectional views showing the process of the method for manufacturing the nonvolatile semiconductor memory device according to the first embodiment, corresponding to an area of a long dashed double-dotted line in FIG. 1C.

FIGS. 10A, 10B are sectional views showing a structure of a nonvolatile semiconductor memory device according to a second embodiment.

FIG. 11A to FIG. 13A and FIG. 11B to FIG. 13B are sectional views showing a process of a method for manufacturing the nonvolatile semiconductor memory device according to the second embodiment.

FIGS. 14A, 14B are sectional views showing a structure of a nonvolatile semiconductor memory device according to a third embodiment.

FIGS. 15A, 16A and FIGS. 15B, 16B are sectional views showing a process of a method for manufacturing the nonvolatile semiconductor memory device according to the third embodiment.

FIGS. 17A, 17B are sectional views showing a structure of a nonvolatile semiconductor memory device according to a fourth embodiment.

FIG. 18A to FIG. 20A and FIG. 18B to FIG. 20B are sectional views showing a process of a method for manufacturing the nonvolatile semiconductor memory device according to the fourth embodiment.

FIGS. 21A, 21B are sectional views showing a structure of a nonvolatile semiconductor memory device according to a fifth embodiment.

FIGS. 22A, 22B are sectional views showing a process of a method for manufacturing the nonvolatile semiconductor memory device according to the fifth embodiment.

DETAILED DESCRIPTION

Figure 1A:
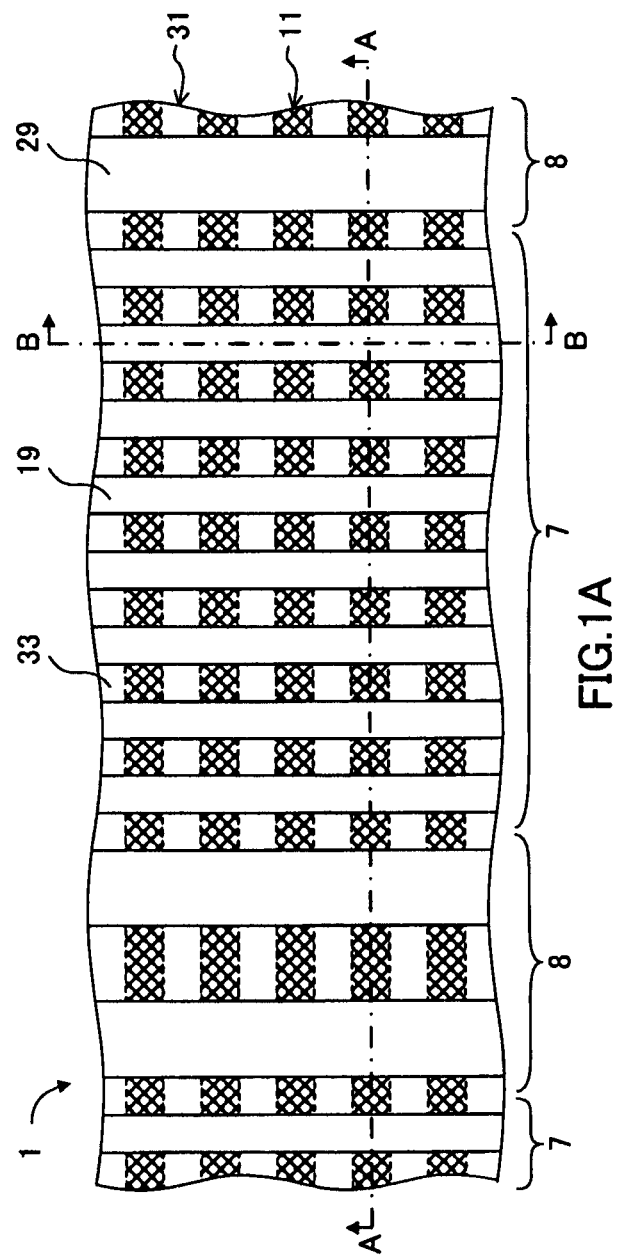
FIG. 1A is a plan view showing a structure of a nonvolatile semiconductor memory device according to a first embodiment.

Hereinafter, embodiments of the invention will be described with reference to the drawings. In the drawings, the same or similar reference numerals will be given to the same or similar portions. FIG. 2A to FIG. 22A correspond to an area enclosed with a long dashed double-dotted line in FIG. 1B, and FIG. 2B to FIG. 22B correspond to an area enclosed with a long dashed double-dotted line in FIG. 1C. Description will be given by defining an upward direction as a direction away from a semiconductor substrate in a surface of the semiconductor substrate.

A nonvolatile semiconductor memory device according to a first embodiment of the invention and a method for manufacturing the same will be described with reference to FIG. 1A to FIG. 1C through FIGS. 9A, 9B.

Figure 1B:
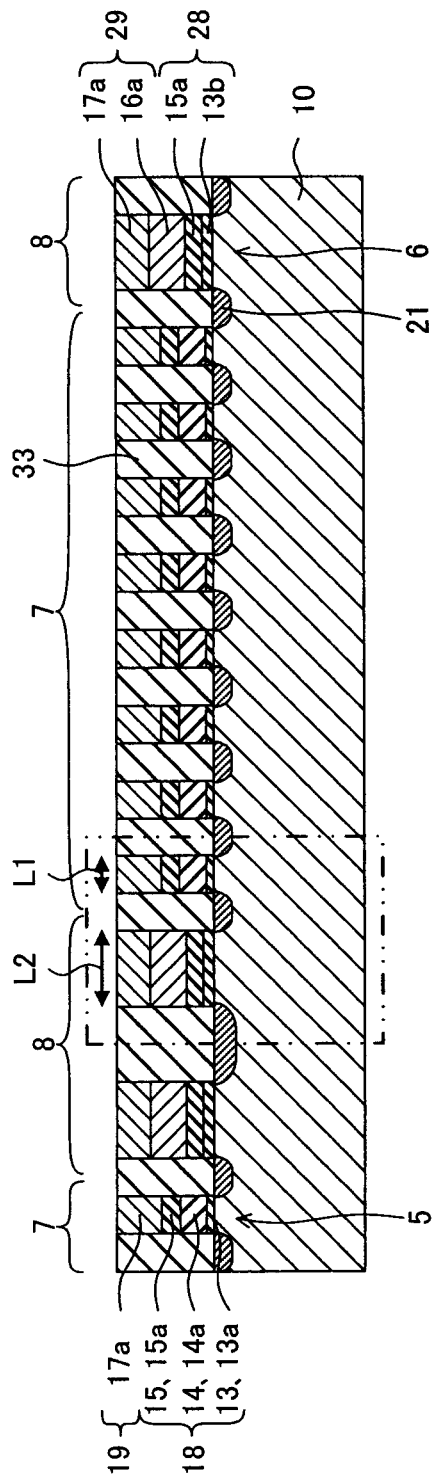
FIG. 1B is a sectional view taken along the A-A line of FIG. 1A.
Figure 1C:
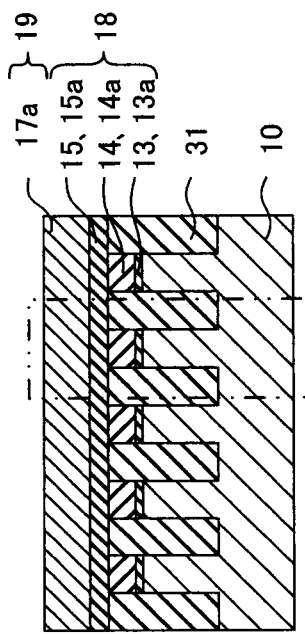
FIG. 1C is a sectional view taken along the B-B line of FIG. 1A.

As shown in FIG. 1A to FIG. 1C, an NAND type nonvolatile semiconductor memory device 1 has multiple diffused regions 21 each of which serves as a source and a drain and which are arranged in a surface of a semiconductor substrate 10 so as to be apart from each other. A memory cell transistor 5 includes a gate insulating layer 18 as a first insulating layer having a charge storage insulating layer 14 and formed on the surface of the semiconductor substrate 10 between each pair of the adjacent diffused regions 21. The memory cell transistor 5 further includes a gate electrode 19 as a first gate electrode in which a silicide layer 17a having a width L1 as a first width is formed in contact with the gate insulating layer 18. A select transistor 6 includes a gate insulating layer 28 as a second insulating layer formed on the surface of the semiconductor substrate 10 located away from the memory cell transistors 5 with one diffused region 21 therebetween. The select transistor 6 further includes a gate electrode 29 as a second gate electrode formed in contact with the gate insulating layer 28. In the gate electrode 29, a polysilicon layer 16a and the silicide layer 17a having a width L2 as a second width larger than the width L1 are sequentially formed in the gate electrode 29. The polysilicon layer 16a is made of an impurity-doped silicon.

As shown in FIG. 1A, in the nonvolatile semiconductor memory device 1, multiple element regions 11 (shown with a mesh pattern) are provided in parallel with each other in stripes extending in a longitudinal direction of FIG. 1A. Within the element region 11, the diffused regions 21 each serving as a source and a drain are provided apart from each other, as shown in FIG. 1B. An isolation region 31 composed of a silicon oxide layer, for example, is provided between each pair of adjacent element regions 11.

The gate electrodes 19 of the memory cell transistors 5 are provided in parallel with each other in stripes extending in a short-side direction of FIG. 1B, and intersecting perpendicularly to the element regions 11. Memory cells correspond respectively to the memory cell transistors 5, and are arranged in a memory cell region 7 in a lattice form.

A pair of the gate electrodes 29 of the select transistors 6 are provided respectively on both sides of the memory cell region 7 in such a way as to extend parallel to the gate electrodes 19 and to sandwich the memory cell region 7. In other words, an NAND string is formed with a structure in which sources and drains of the memory cell transistors 5, i.e., adjacent two of the diffusion regions 21 are connected in common to each of the memory cell transistors 5, and in which the select transistors 6 are provided on both sides of the memory cell transistors 5. Two gate electrodes 29 are provided in one select gate region 8. While two gate electrodes 29 in one select gate region 8 are shown here, one gate electrode 29 in one select gate region 8 may be used as long as it has a selection function.

As shown in FIGS. 1B, 1C, the semiconductor substrate 10 is a p type silicon substrate, for example, and n type impurities such as As are implanted into the diffused region 21. As for the diffused region 21, extension regions each extended toward a facing diffused region 21 side are often provided. A part between the adjacent diffused regions 21 functions as a channel region (not shown). The semiconductor substrate 10 can have a substrate structure provided with a p type well, and can be a silicon-on-insulator (SOI) substrate having p type silicon on an insulating layer. Use of the SOI substrate can reduce erroneous write. Moreover, the semiconductor substrate 10 and the diffused regions 21 can respectively be formed so as to have conductivity types opposite to those mentioned above.

An interlayer insulating layer 33 composed of a silicon insulating layer, for example, is buried into spaces among the gate insulating layers 18, 28 and the gate electrodes 19, 29. Although illustration will be omitted, side wall portions and an upper portion of the gate insulating layers 18, 28 and the gate electrodes 19, 29 are covered with an insulating layer composed of at least one of a silicon oxide layer, a silicon nitride layer, and a silicon oxynitride layer.

In the memory cell region 7, the gate insulating layer 18 is provided in an upper portion of the channel region between the adjacent diffused regions 21, the gate insulating layer 18 being composed of a silicon oxide layer 13a corresponding to a tunneling insulating layer 13, a silicon nitride layer 14a corresponding to the charge storage insulating layer 14, and a silicon oxide layer 15a corresponding to a blocking insulating layer 15. The tunneling insulating layer 13 can be composed of either of a silicon oxide layer, a silicon oxynitride layer, and a layer obtained by stacking a silicon oxide layer and a silicon nitride layer. An aluminum oxide layer, for example, having a higher dielectric constant can be used for the blocking insulating layer 15.

The gate electrode 19 of the memory cell transistor 5 has a silicide layer 17a of the width L1 formed in contact with the blocking insulating layer 15, which is the top layer of the corresponding gate insulating layer 18. The silicide layer 17a is mainly composed of Ni, for example. The width L1 of the gate electrode 19 is formed so as to be the minimal size in a manufacturing process, for example. Other than this, the silicide layer 17a can be mainly composed of at least one element of Co, Pt, Yb, W, etc.

On the other hand, in the select gate region 8, the gate insulating layer 28 composed of the silicon oxide layer 13b and the silicon oxide layer 15a is provided in an upper portion of the channel region between the adjacent diffused regions 21.

The gate electrode 29 of the select transistor 6 has a polysilicon layer 16a of the width L2 formed in contact with the silicon oxide layer 15a, and has a silicide layer 17a of the width L2 formed in contact with the polysilicon layer 16a on a side opposite to the silicon oxide layer 15a. In other words, a boundary between the polysilicon layer 16a and the silicide layer 17a is located within the gate electrode 29 in a height direction from the surface of the semiconductor substrate 10. A channel length under the gate electrode 29 is set larger than a channel length under the gate electrode 19 in order to demonstrate controllability of the transistor. Namely, the width L2 is formed larger than the width L1, and for example, twice or more as large as the width L1.

Impurities such as P are introduced into the polysilicon layer 16a and formed so as to have a low resistance. The impurities of the polysilicon layer 16a can be selected from other impurities of an n type or p type where relevant.

A method for manufacturing the nonvolatile semiconductor memory device 1 will be described. In description of a manufacturing process, the above-mentioned configuration will be supplemented with materials or configuration to form the nonvolatile semiconductor memory device 1.

Figure 2A:
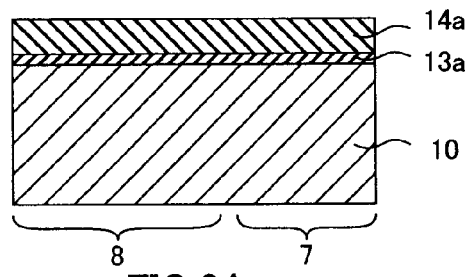
Figure 2B:
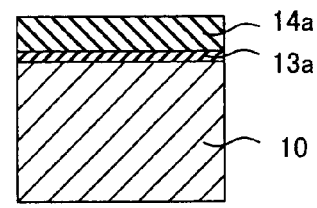

As shown in FIGS. 2A, 2B, the silicon oxide layer 13a is formed on the surface of the semiconductor substrate 10 by a thermal oxidation method, and the silicon nitride layer 14a is then formed on the silicon oxide layer 13a by a chemical vapor deposition (CVD) method. Subsequently, amorphous silicon patterned by a photolithography method, for example, is formed on the silicon nitride layer 14a and reactive ion etching (RIE) is then performed using the amorphous silicon as a mask, although illustration will be omitted.

Figure 3A:
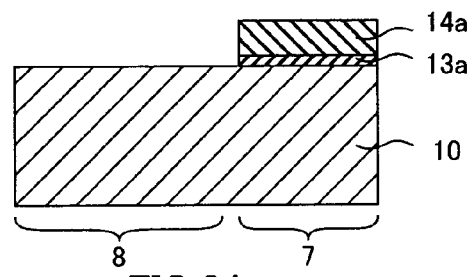
Figure 3B:
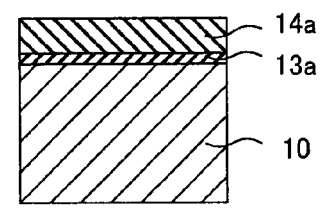

As shown in FIGS. 3A, 3B, the silicon oxide layer 13a and the silicon nitride layer 14a remain in the memory cell region 7 (on the right side of FIG. 3A), whereas the silicon oxide layer 13a and the silicon nitride layer 14a are etched in the select gate region 8 (on the left side of FIG. 3A).

Figure 4A:
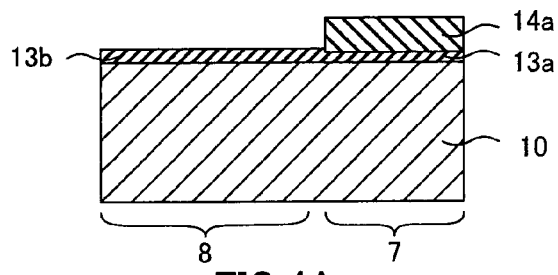
Figure 4B:
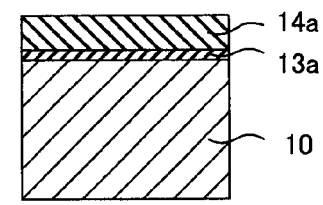

As shown in FIGS. 4A, 4B, the silicon oxide layer 13b is formed on the surface of the semiconductor substrate 10 by the thermal oxidation method. Subsequently, amorphous silicon patterned by the photolithography method, for example, is formed on the silicon oxide layer 13b and the silicon nitride layer 14a, and etching by the RIE method is performed using the amorphous silicon as a mask, although illustration will be omitted. Trenches 41 are formed in areas to be formed as the isolation regions 31 (on the right and left end sides of FIG. 4B). Next, for example, a silicon oxide layer is buried into the trenches 41 by the CVD method, and planarization or etching is then performed.

Figure 5A:
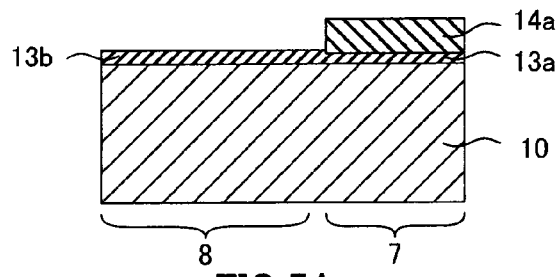
Figure 5B:
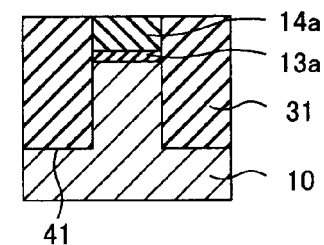

As shown in FIGS. 5A, 5B, the isolation regions 31 are formed in the trenches 41, so that upper surfaces of the silicon oxide layer 13b, the silicon nitride layer 14a, and the isolation regions 31 are exposed.

Figure 6A:
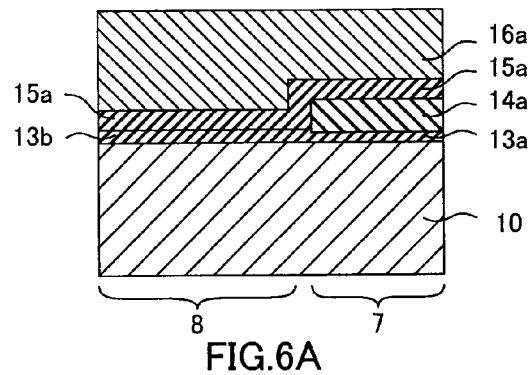
Figure 6B:
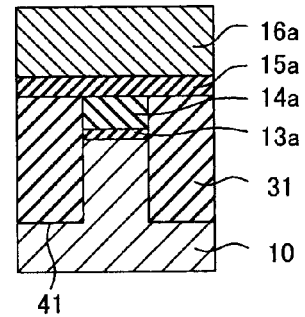

As shown in FIGS. 6A, 6B, the silicon oxide layer 15a is formed on the surfaces of the silicon oxide layer 13b, the silicon nitride layer 14a, and the isolation regions 31 by the CVD method. Subsequently, the P-doped polysilicon layer 16a is formed on the surface of the silicon oxide layer 15a. Subsequently, a silicon nitride layer patterned by the photolithography method is formed on the polysilicon layer 16a, and etching by the RIE method is then performed using the silicon nitride layer as a mask, although illustration will be omitted.

Figure 7A:
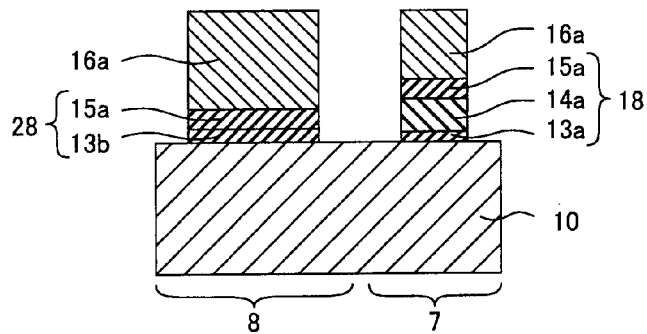
Figure 7B:
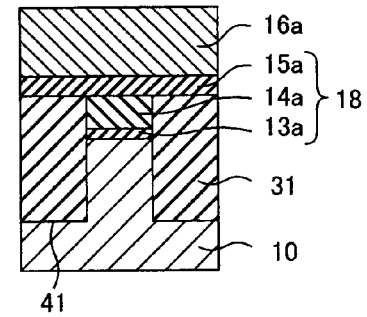

As shown in FIGS. 7A, 7B, the silicon oxide layer 13a, the silicon nitride layer 14a, the silicon oxide layer 15a, and the polysilicon layer 16a each having approximately the width L1 are formed in an area which will be the gate insulating layer 18 and the gate electrode 19. The silicon oxide layer 13b, the silicon oxide layer 15a, and the polysilicon layer 16a each having approximately the width L2 are formed in an area which will be the gate insulating layer 28 and the gate electrode 29. Subsequently, although illustration will be omitted, an insulating layer composed of at least one of a silicon oxide layer, a silicon nitride layer, and a silicon oxynitride layer is formed on side wall portions and an upper portion of each of the deposited layers thus formed, and ion implantation is then performed on the surface of the semiconductor substrate 10 to form the diffused regions 21. Alternatively, before formation of the insulating layer on the side walls, ion implantation can be performed to form the extension regions.

Figure 8A:
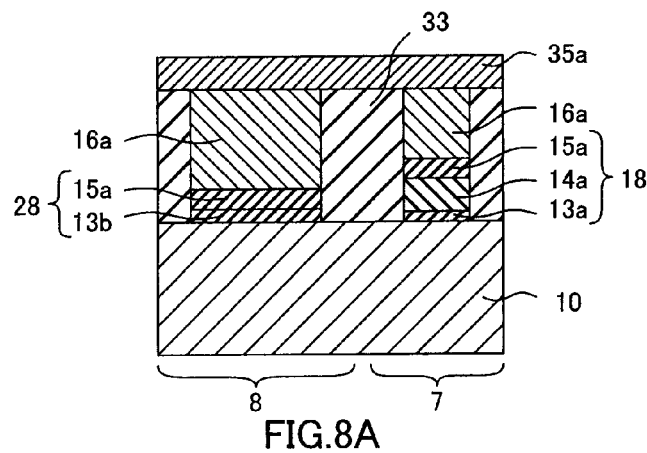
Figure 8B:
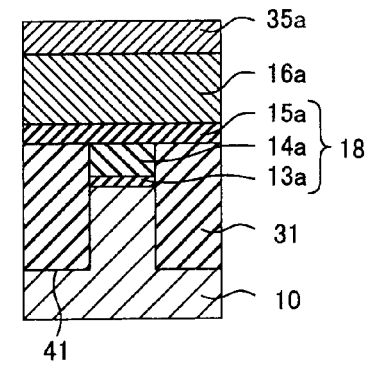

As shown in FIGS. 8A, 8B, the interlayer insulating layer 33 composed of a tetraethoxysilane (TEOS)-based silicon oxide layer is buried between areas which will be the gate insulating layers 18, 28 and the gate electrodes 19, 29. Next, planarization is performed by a CMP method so that an upper surface of the polysilicon layer 16a may be exposed. A metal layer 35a for silicidation made of Ni, for example, is deposited on the planarized interlayer insulating layer 33 and polysilicon layer 16a by the CVD method.

As shown in FIGS. 9A, 9B, heat treatment is performed to react the polysilicon layer 16a with the metal layer 35a, so that the silicide layer 17a fully silicided is formed on the gate insulating layer 18. Simultaneously, the polysilicon layer 16a having a silicide layer 17a by siliciding only its upper portion is formed on the gate insulating layer 28. In other words, the gate electrode 19 on the gate insulating layer 18 is composed of the silicide layer 17a of the width L1, whereas the gate electrode 29 on the gate insulating layer 28 is composed of the polysilicon layer 16a and the silicide layer 17a of the width L2.

The silicidation, in which the polysilicon layer 16a reacts to the metal layer 35a by heat treatment, progresses faster for the narrower polysilicon layer 16a of the width L1 than for the wider polysilicon layer 16a of the width L2. The width L1 and the width L2 are determined so that the polysilicon layer 16a of the width L1 may be fully silicided while a part of the polysilicon layer 16a of the width L2 may not be silicided and thus remain stably on the gate insulating layer 28. A difference in a silicidation rate varies depending on a heating temperature, properties of the metal layer 35a such as a species and a thickness, and properties of the polysilicon layer 16a such as a thickness, an impurity density, and crystallinity. In the embodiment, the width L2 is approximately 3 times larger than the width L1. Other than Ni, the above-mentioned elements such as Co, Pt, Yb, W can be used for the metal layer 35a.

As mentioned above, in the nonvolatile semiconductor memory device 1, the gate electrode 19 of each memory cell transistor 5 of the memory cell region 7 has the width L1, and the gate electrode 29 of each select transistor 6 of the select gate region 8 has the width L2 larger than the width L1. The gate electrode 19 is entirely composed of the silicide layer 17a in contact with the gate insulating layer 18. The gate electrode 29 is composed of the polysilicon layer 16a in contact with the gate insulating layer 28 and the silicide layer 17a on the polysilicon layer 16a.

As a result, in the charge trap type nonvolatile semiconductor memory device 1, it is possible to configure the memory cell transistor 5 and the select transistor 6 so that the gate electrodes 19, 29 may have different work functions. Since the gate electrodes 19, 29 having different work functions are obtained, the nonvolatile semiconductor memory device 1 can have a threshold voltage of the memory cell transistor 5 and that of the select transistor 6 set at a more suitable value.

A nonvolatile semiconductor memory device according to a second embodiment of the invention will be described with reference to FIGS. 10A, 10B through FIGS. 13A, 13B. What is different from the nonvolatile semiconductor memory device 1 according to the first embodiment is the configuration in which a gate electrode of each memory cell transistor includes a metal nitride layer arranged on the gate insulating layer. The same reference numerals will be given to the same portions as those in the first embodiment, and description of those portions will be omitted.

As shown in FIGS. 10A, 10B, the nonvolatile semiconductor memory device according to the embodiment is different from the nonvolatile semiconductor memory device 1 according to the first embodiment in a configuration of a gate electrode 61 of each memory cell transistor 71 in the memory cell region 7 and a configuration of a gate electrode 62 of each select transistor 72 in the select gate region 8. Specifically, the gate electrode 61 has a metal nitride layer 51a made of TaN, for example, and formed in contact with the gate insulating layer 18, and has a polysilicon layer 53a formed on the metal nitride layer 51a. On the other hand, the gate electrode 62 has a polysilicon layer 53a formed in contact with the gate insulating layer 28. A width of the gate electrode 62 is set larger than a width of the gate electrode 61 in order to demonstrate controllability of the transistor. Other configurations are the same as those of the nonvolatile semiconductor memory device 1 according to the first embodiment, and the polysilicon layer 53a is the same as the polysilicon layer 16a of the first embodiment. Other than TaN, TiN, WN, TaSiN, etc. can be used for the metal nitride layer 51a.

A method for manufacturing the nonvolatile semiconductor memory device according to the embodiment will be described. The process until the step shown in FIGS. 6A, 6B is performed in the same manner as in the method for manufacturing the nonvolatile semiconductor memory device 1 according to the first embodiment. Next, as shown in FIGS. 11A, 11B, the silicon oxide layer 15a is formed on the surfaces of the silicon oxide layer 13b, the silicon nitride layer 14a, and the isolation regions 31 by the CVD method. Subsequently, the metal nitride layer 51a is formed on the surface of the silicon oxide layer 15a by the CVD method. Thereafter, a silicon nitride layer patterned by the photolithography method is formed on the metal nitride layer 51a, and etching by the RIE method is then performed using the silicon nitride layer as a mask, although illustration will be omitted.

As shown in FIGS. 12A, 12B, the metal nitride layer 51a remains in the memory cell region 7 (on the right side of FIG. 12A), whereas the metal nitride layer 51a is etched in the select gate region 8 (on the left side of FIG. 12A).

As shown in FIGS. 13A, 13B, the P-doped polysilicon layer 53a is formed on the surfaces of the silicon oxide layer 15a and the metal nitride layer 51a. Subsequently, a silicon nitride layer patterned by the photolithography method is formed on the polysilicon layer 53a, and etching by the RIE method is then performed using the silicon nitride layer as a mask, although illustration will be omitted.

As shown in FIGS. 10A, 10B, the interlayer insulating layer 33 is formed in the same manner as in the step shown in FIGS. 7A, 7B and a part of the step shown in FIGS. 8A, 8B according to the first embodiment. The gate electrode 61 having the above-mentioned configuration is formed in the memory cell region 7, and the gate electrode 62 having the above-mentioned configuration is formed in the select gate region 8.

As mentioned above, in the nonvolatile semiconductor memory device according to the embodiment, the gate electrode 61 of the memory cell transistor 71 is composed of the metal nitride layer 51a in contact with the gate insulating layer 18 and the polysilicon layer 53a on the metal nitride layer 51a. The gate electrode 62 of the select transistor 72 is composed of the polysilicon layer 53a in contact with the gate insulating layer 28.

As a result, in the nonvolatile semiconductor memory device according to the embodiment, it is possible to configure the memory cell transistor 71 and the select transistor 72 so that the gate electrodes 61, 62 may have different work functions. The nonvolatile semiconductor memory device according to the embodiment has the same effect as that of the nonvolatile semiconductor memory device 1 according to the first embodiment. Additionally, the width of the gate electrode of the nonvolatile semiconductor memory device according to the embodiment has fewer restrictions than those on the width of the gate electrode of the nonvolatile semiconductor memory device 1 according to the first embodiment.

A nonvolatile semiconductor memory device according to a third embodiment of the invention will be described with reference to FIGS. 14A, 14B through FIGS. 16A, 16B. What is different from the nonvolatile semiconductor memory device 1 according to the first embodiment is the configuration in which a gate electrode of each select transistor includes a metal nitride layer arranged on the gate insulating layer. The same reference numerals will be given to the same portions as those in the first and second embodiments, and description of those portions will be omitted.

As shown in FIGS. 14A, 14B, the nonvolatile semiconductor memory device according to the embodiment is different from the nonvolatile semiconductor memory device 1 according to the first embodiment in a configuration of a gate electrode 63 of each memory cell transistor 73 in the memory cell region 7 and a configuration of a gate electrode 64 of each select transistor 74 in the select gate region 8. Specifically, the gate electrode 63 has a polysilicon layer 53a formed in contact with the gate insulating layer 18. On the other hand, the gate electrode 64 has a metal nitride layer 51a made of TaN, for example, and formed in contact with the gate insulating layer 28, and has a polysilicon layer 53a formed on the metal nitride layer 51a. A width of the gate electrode 64 is set larger than a width of the gate electrode 63 in order to demonstrate controllability of the transistor. Other configurations are the same as those of the nonvolatile semiconductor memory device 1 according to the first embodiment.

A method for manufacturing the nonvolatile semiconductor memory device according to the embodiment will be described. The process until the step shown in FIGS. 11A and 11B is performed in the same manner as in the method for manufacturing the nonvolatile semiconductor memory device 1 according to the second embodiment. Thereafter, a silicon nitride layer patterned by the photolithography method is formed on the metal nitride layer 51a, and etching by the RIE method is then performed using the silicon nitride layer as a mask, although illustration will be omitted.

As shown in FIGS. 15A, 15B, the metal nitride layer 51a is etched in the memory cell region 7 (on the right side of FIG. 15A), whereas the metal nitride layer 51a remains in the select gate region 8 (on the left side of FIG. 15A).

As shown in FIGS. 16A, 16B, the P-doped polysilicon layer 53a is formed on the surfaces of the silicon oxide layer 15a and the metal nitride layer 51a. Subsequently, a silicon nitride layer patterned by the photolithography method is formed on the polysilicon layer 53a, and etching by the RIE method is then performed using the silicon nitride layer as a mask, although illustration will be omitted.

As shown in FIGS. 14A, 14B, the gate electrode 63 having the above-mentioned configuration is formed in above-mentioned memory cell region 7, and the gate electrode 64 having the above-mentioned configuration is formed in the select gate region 8 in the same manner as in the step shown in FIGS. 10A, 10B in the second embodiment.

As mentioned above, in the nonvolatile semiconductor memory device according to the embodiment, the gate electrode 63 of the memory cell transistor 73 is composed of the polysilicon layer 53a in contact with the gate insulating layer 18. The gate electrode 64 of the select transistor 74 is composed of the metal nitride layer 51a in contact with the gate insulating layer 28 and the polysilicon layer 53a on the metal nitride layer 51a.

As a result, in the nonvolatile semiconductor memory device according to the embodiment, it is possible to configure the memory cell transistor 73 and the select transistor 74 so that the gate electrodes 63, 64 may have different work functions. The nonvolatile semiconductor memory device according to the embodiment has the same effect as that of the nonvolatile semiconductor memory device 1 according to the first embodiment. Moreover, the gate electrodes 63, 64 in the nonvolatile semiconductor memory device according to the embodiment have the work functions opposite to those of the gate electrodes 61, 62 in the nonvolatile semiconductor memory device according to the second embodiment. However, the nonvolatile semiconductor memory device according to the embodiment has the same effect as that of the nonvolatile semiconductor memory device according to the second embodiment.

A nonvolatile semiconductor memory device according to a fourth embodiment of the invention will be described with reference to FIGS. 17A, 17B through FIGS. 20A, 20B. What is different from the nonvolatile semiconductor memory device 1 according to the first embodiment is the configuration in which a gate electrode of each memory cell transistor includes a metal nitride layer formed on the gate insulating layer, and a gate electrode of each select transistor includes a metal layer formed on the gate insulating layer. The same reference numerals will be given to the same portions as those in the first to third embodiments, and description of those portions will be omitted.

As shown in FIGS. 17A, 17B, the nonvolatile semiconductor memory device according to the embodiment is different from the nonvolatile semiconductor memory device according to the second embodiment in a configuration of a gate electrode 65 of each select transistor 75 in the select gate region 8. Specifically, the gate electrode 65 has a metal layer 52a made of Ru, for example, and formed in contact with the gate insulating layer 28, and has the polysilicon layer 53a formed on the metal layer 52a. A width of the gate electrode 65 is set larger than a width of the gate electrode 61 in order to demonstrate controllability of the transistor. Other configurations are the same as those of the nonvolatile semiconductor memory device according to the second embodiment. Other than Ru, Au, Pt, Co, Be, Ni, Rh, Pd, Te, Re, Mo, Al, Hf, Ta, Mn, Zn, Zr, In, Bi, W, Ir, Er, La, Ti, Y, Yb, etc. can be used for the metal layer 52a.

A method for manufacturing the nonvolatile semiconductor memory device according to the embodiment will be described. The process until the step shown in FIGS. 12A, 12B is performed in the same manner as in the method for manufacturing the nonvolatile semiconductor memory device according to the second embodiment. Next, as shown in FIGS. 18A, 18B, the metal layer 52a is formed on the surfaces of the silicon oxide layer 15a and the metal nitride layer 51a by the CVD method. Subsequently, a silicon nitride layer patterned by the photolithography method is formed on the metal layer 52a, and etching by the RIE method is then performed using the silicon nitride layer as a mask, although illustration will be omitted.

As shown in FIGS. 19A, 19B, the metal layer 52a is etched in the memory cell region 7 (on the right side of FIG. 19A), whereas the metal layer 52a remains in the select gate region 8 (on the left side of FIG. 19A).

As shown in FIGS. 20A, 20B, the P-doped polysilicon layer 53a is formed on the surfaces of the metal nitride layer 51a and the metal layer 52a. Subsequently, a silicon nitride layer patterned by the photolithography method is formed on the polysilicon layer 53a, and etching by the RIE method is then performed using the silicon nitride layer as a mask, although illustration will be omitted.

As shown in FIGS. 17A, 17B, the gate electrode 61 having the above-mentioned configuration is formed in the memory cell region 7 and the gate electrode 65 having the above-mentioned configuration is formed in the select gate region 8 in the same manner as in the step shown in FIGS. 10A, 10B in the second embodiment.

As mentioned above, in the nonvolatile semiconductor memory device according to the embodiment, the gate electrode 61 of the memory cell transistor 71 is composed of the metal nitride layer 51a in contact with the gate insulating layer 18 and the polysilicon layer 53a on the metal nitride layer 51a. The gate electrode 65 of the select gate region 8 is composed of the metal layer 52a in contact with the gate insulating layer 28 and the polysilicon layer 53a on the metal layer 52a.

As a result, in the nonvolatile semiconductor memory device according to the embodiment, it is possible to configure the memory cell transistor 71 and the select transistor 75 so that the gate electrodes 61, 65 may have different work functions. The nonvolatile semiconductor memory device according to the embodiment has the same effect as those of the nonvolatile semiconductor memory device according to the first to third embodiments. Furthermore, it is possible to select more suitable work functions as the work functions of the gate electrodes 61, 65 of the nonvolatile semiconductor memory device according to the embodiment, since combination of the materials for the metal nitride layer 51a and for the metal layer 52a can be selected where relevant.

A nonvolatile semiconductor memory device according to a fifth embodiment of the invention will be described with reference to FIGS. 21A, 21B and FIGS. 22A, 22B. What is different from the nonvolatile semiconductor memory device according to the fourth embodiment is the configuration in which a gate electrode of each memory cell transistor includes a metal nitride layer and a metal layer arranged on the gate insulating layer. The same reference numerals will be given to the same portions as those in the first to forth embodiments, and description of those portions will be omitted.

As shown in FIGS. 21A, 21B, the nonvolatile semiconductor memory device according to the embodiment is different from the nonvolatile semiconductor memory device according to the forth embodiment in a configuration of a gate electrode 66 of each memory cell transistor 76 in the memory cell region 7. Specifically, the gate electrode 66 has the metal nitride layer 51a formed in contact with the gate insulating layer 18, the metal layer 52a formed on the metal nitride layer 51a, and the polysilicon layer 53a formed on the metal layer 52a. A width of the gate electrode 65 is set larger than a width of the gate electrode 66 in order to demonstrate controllability of the transistor. Other configurations are the same as those of the nonvolatile semiconductor memory device according to the fourth embodiment.

A method for manufacturing the nonvolatile semiconductor memory device according to the embodiment will be described. The process until the step shown in FIGS. 18A, 18B is performed in the same manner as in the method for manufacturing the nonvolatile semiconductor memory device according to the fourth embodiment. Next, as shown in FIGS. 22A, 22B, the P-doped polysilicon layer 53a is formed on the surface of the metal layer 52a. Thereafter, a silicon nitride layer patterned by the photolithography method is formed on the metal nitride layer 53a, and etching by the RIE method is then performed using the silicon nitride layer as a mask, although illustration will be omitted.

As shown in FIGS. 21A, 21B, the gate electrode 66 having the above-mentioned configuration is formed in the memory cell region 7 and the gate electrode 65 having the above-mentioned configuration is formed in the select gate region 8 in the same manner as in the step shown in FIGS. 17A, 17B in the fourth embodiment.

As mentioned above, in the nonvolatile semiconductor memory device according to the embodiment, the gate electrode 66 of the memory cell transistor 76 is composed of the metal nitride layer 51a, the metal layer 52a, and the polysilicon layer 53a in this order, the metal nitride layer 51a being in contact with the gate insulating layer 18. The gate electrode 65 of a select transistor 75 is composed of the metal layer 52a in contact with the gate insulating layer 28 and the polysilicon layer 53a on the metal layer 52a.

As a result, in the nonvolatile semiconductor memory device according to the embodiment, it is possible to configure the memory cell transistor 76 and the select transistor 75 so that the gate electrodes 65, 66 may have different work functions. The nonvolatile semiconductor memory device according to the embodiment has the same effect as that of the nonvolatile semiconductor memory device according to the fourth embodiment. Moreover, the nonvolatile semiconductor memory device according to the embodiment can shorten the manufacturing process compared with the nonvolatile semiconductor memory device according to the fourth embodiment since the step of etching the metal layer 52a is not needed in the embodiment.

A nonvolatile semiconductor memory device according to a sixth embodiment of the invention will be described with reference to FIGS. 23, 24. What is different from the nonvolatile semiconductor memory device according to the second embodiment is that each memory cell transistor is perpendicularly connected to the semiconductor substrate. The same reference numerals will be given to the same portions as those in the first to fifth embodiments, and description of those portions will be omitted.

Figure 23:
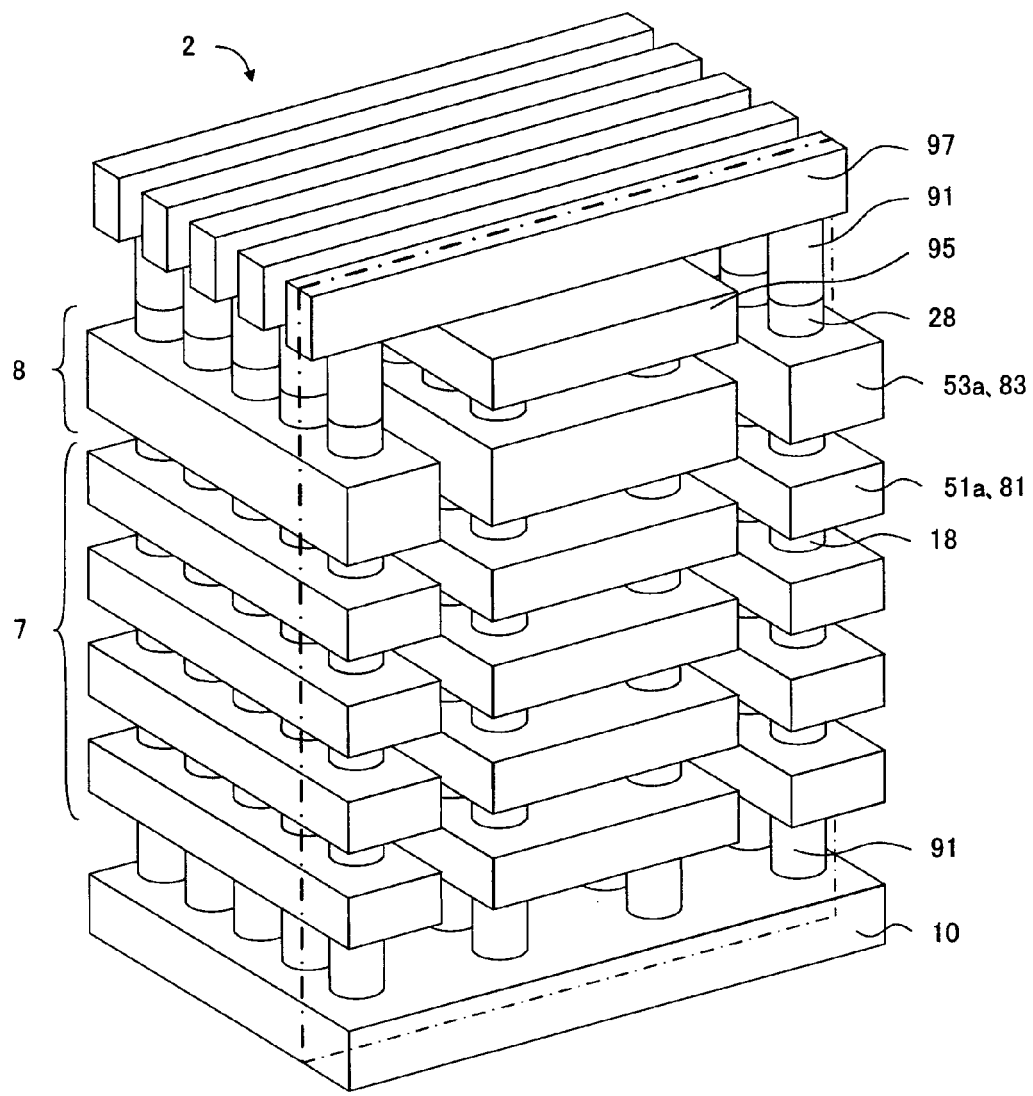
FIG. 23 is a perspective view showing a structure of a nonvolatile semiconductor memory device according to a sixth embodiment.
Figure 24:
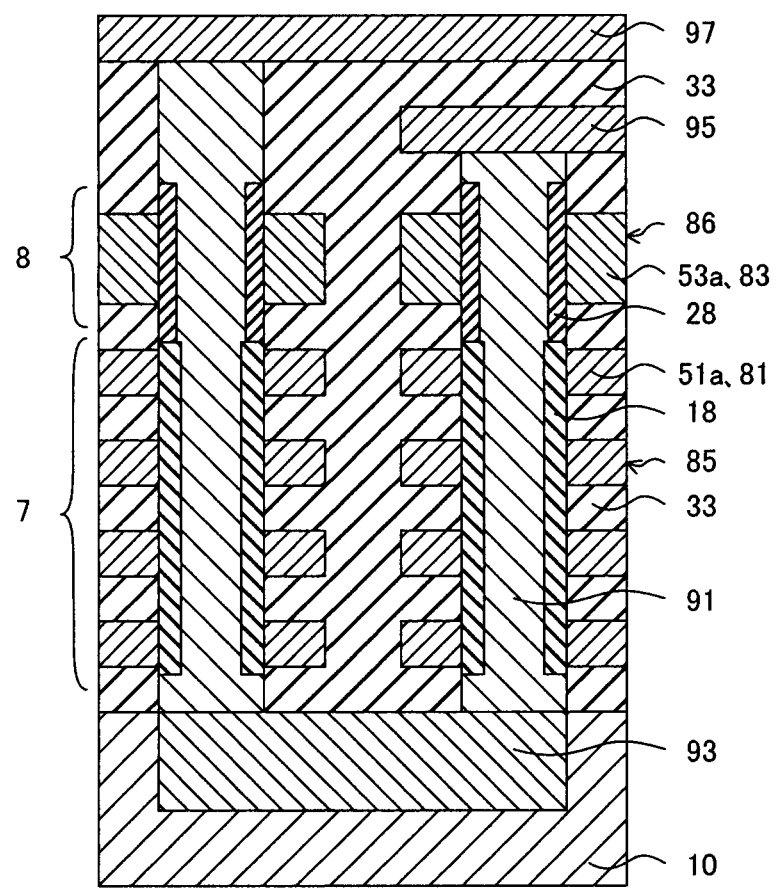
FIG. 24 is a sectional view showing a half of a surface of the nonvolatile semiconductor memory device according to the sixth embodiment taken along a long dashed dotted line shown in FIG. 23.

As shown in FIGS. 23, 24, a nonvolatile semiconductor memory device 2 is provided with column-shaped semiconductor portions 91 approximately perpendicular to the semiconductor substrate 10. The nonvolatile semiconductor memory device 2 is provided with memory cell transistors 85 including the gate insulating layer 18 and gate electrodes 81. The gate insulating layer 18 having the charge storage insulating layer 14 (see FIG. 1B) is provided on a surface of the column-shaped semiconductor portion 91. The gate electrodes 81 are electrodes in which the metal nitride layers 51a apart from each other are formed on circumferential surfaces of the gate insulating layer 18. A select transistor 86 is provided above each memory cell transistor 85 located on a side of the column-shaped semiconductor portion 91 opposite to the semiconductor substrate 10. The select transistor 86 includes the gate insulating layer 28 formed on a circumferential surface of the column-shaped semiconductor portion 91, and a gate electrode 83 having the impurity-doped polysilicon layer 53a formed on a circumferential surface of the gate insulating layer 28. A conductive layer 93 to electrically connect two adjacent column-shaped semiconductor portions 91 is provided in a surface of the semiconductor substrate 10.

In the nonvolatile semiconductor memory device 2, an upper end of one column-shaped semiconductor portion 91 is connected to a bit line 97 while an upper end of another adjacent column-shaped semiconductor portion 91 is connected to a source line 95. Lower ends of the column-shaped semiconductor portions 91 are connected to each other through a conductive layer 93 made of an n type semiconductor, for example. Four memory cell transistors 85, for example, are disposed on each of the two column-shaped semiconductor portions 91. Each gate electrode 81 is controlled independently. In other words, the memory cell transistors 85 and the select transistors 86 configure a U-shaped NAND string. A width of each gate electrode 83 in a direction along the column-shaped semiconductor portion 91 is set larger than a width of each gate electrode 81 in order to demonstrate controllability of the transistor. In other words, the gate electrode 83 has a thickness larger than that of the gate electrode 81 in a direction perpendicular to the semiconductor substrate 10.

The gate electrode 81 is a single layer of the metal nitride layer 51a made of TaN, for example. The gate electrode 83 is a single layer of the p-doped polysilicon layer 53a, for example. The gate electrode 81 only needs to include the metal nitride layer 51a on the column-shaped semiconductor portion 91 side. Accordingly, similarly to the second embodiment, the gate electrode 81 may have a configuration in which the polysilicon layer 53a is formed on the circumference of the metal nitride layer 51a.

As mentioned above, similarly to the nonvolatile semiconductor memory device according to the second embodiment, in the nonvolatile semiconductor memory device 2, the gate electrode 81 of the memory cell transistor 85 is composed of the metal nitride layer 51a in contact with the gate insulating layer 18. The gate electrode 83 of the select transistor 86 is composed of the polysilicon layer 53a in contact with the gate insulating layer 28.

As a result, in the nonvolatile semiconductor memory device 2, it is possible to configure the memory cell transistor 85 and the select transistor 86 so that the gate electrodes 81, 83 may have different work functions. The nonvolatile semiconductor memory device according to the embodiment has the same effect as that of the nonvolatile semiconductor memory device according to the second embodiment. Additionally, the nonvolatile semiconductor memory device 2 includes the memory cell transistors 85 stacked vertically to the surface of the semiconductor substrate 10. Accordingly, it is possible to increase the number of the memory cell transistors 85 per area. Moreover, in the nonvolatile semiconductor memory device 2, even when the number of stacked layers of the memory cell transistors 85 is increased, increase in the number of manufacturing steps is less. Accordingly, unit cost (bit cost) reduction of the memory cell transistor 85 is possible.

Figure 25:
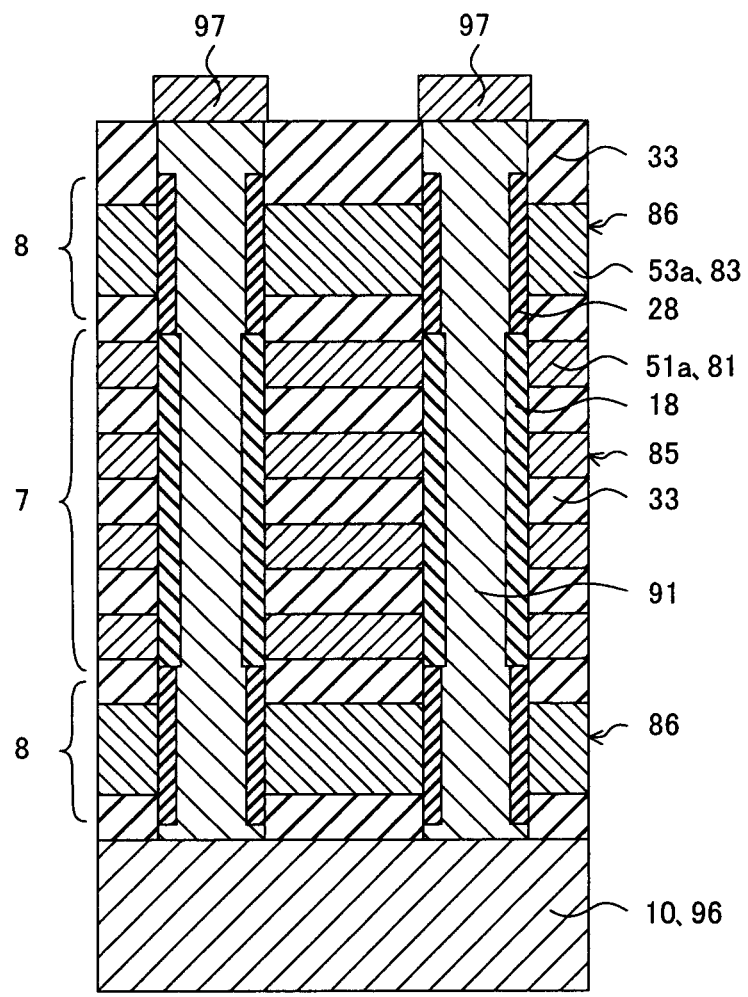
FIG. 25 is a sectional view showing a structure of a nonvolatile semiconductor memory device according to a modification of the sixth embodiment.

A nonvolatile semiconductor memory device according to a modification of the sixth embodiment of the invention will be described with reference to FIG. 25. FIG. 25 is a diagram showing a cross section corresponding to that of FIG. 24. What is different from the nonvolatile semiconductor memory device 2 according to the sixth embodiment is that the NAND string is composed of one column-shaped semiconductor portion. The same reference numerals will be given to the same portions as those in the first to sixth embodiments, and description of those portions will be omitted.

As shown in FIG. 25, the nonvolatile semiconductor memory device according to the modification is different from the nonvolatile semiconductor memory device 2 in that the select transistors 86 are disposed at both end sides of the memory cell transistors 85 on one column-shaped semiconductor portion 91. The semiconductor substrate 10 side of the column-shaped semiconductor portion 91 is connected to a source line 96 through one select transistor 86, while the side of the column-shaped semiconductor portion 91 opposite to the semiconductor substrate 10 is connected to a bit line 97 through the other select transistor 86, for example. The gate electrode 81 composed of the metal nitride layer 51a is shared between adjacent NAND strings.

As mentioned above, similarly to the nonvolatile semiconductor memory device 2 according to the sixth embodiment, in the nonvolatile semiconductor memory device according to the modification, the gate electrode 81 of the memory cell transistor 85 is composed of the metal nitride layer 51a in contact with the gate insulating layer 18. The gate electrode 83 of the select transistor 86 is composed of the polysilicon layer 53a in contact with the gate insulating layer 28.

As a result, the nonvolatile semiconductor memory device according to the modification has the same effect as that of the nonvolatile semiconductor memory device 2. In addition, compared with the nonvolatile semiconductor memory device 2, in the nonvolatile semiconductor memory device according to the modification, the number of the memory cell transistors 85 to the number of stacked layers per NAND string is reduced approximately by a half. However, it is possible to increase the number of the column-shaped semiconductor portions 91 per surface area of the semiconductor substrate 10.

Needless to say, in the nonvolatile semiconductor memory devices according to the sixth embodiment and the modification, it is possible to form the gate electrodes 81, 83 by combining the gate electrode materials for the gate insulating layer 18, 28 described in the first to fifth embodiments where relevant. In other words, the materials for the gate electrodes 81, 83 can be selected from the silicide layer 17a, the metal nitride layer 51a, the metal layer 52a, and the polysilicon layer 53a.

The invention is not limited to the above-mentioned embodiments, and various modifications can be made without departing from the gist of the invention.

An example where the gate insulating layer is a silicon oxide layer, a silicon nitride layer, or a silicon oxynitride layer has been shown in the embodiments. However, the gate insulating layer can be a layer including the so-called high-k layer having a higher dielectric constant, such as an aluminum oxide layer, an oxide layer containing Hf or the like, a silicon oxide layer containing Hf or the like, an oxynitride layer containing Hf or the like, and a silicon oxynitride layer containing Hf or the like, for example.

Moreover, an example of the NAND type nonvolatile semiconductor memory device has been shown in the embodiments. However, the nonvolatile semiconductor memory device can be also applied to a memory cell transistor and a select transistor that configure a different logic such as an AND type.

As an example of the gate electrode in contact with the gate insulating layer in the memory cell transistor and the select transistor, some of combinations of two selected among the polysilicon layer, the silicide layer, the metal nitride layer, and the metal layer have been shown in the embodiments. However, combinations other than the combinations shown in the embodiments can be used.

Moreover, in the embodiments, an example of metal conductive materials such as metal single bodies, silicides, and nitrides has been shown as materials for the gate electrode. However, besides those, metal single bodies or intermetallic compounds including one or more elements shown in the embodiments, or silicides, borides, nitrides, or carbides of these intermetallic compounds can be also used.

What is claimed is:

1. A nonvolatile semiconductor memory device provided with memory cell transistors arranged in a direction and a select transistor to select the memory cell transistors comprising:
- a semiconductor substrate;
- a plurality of memory cell transistors, each of the memory cell transistors having a first insulating layer and a first gate electrode, the first insulating layer including a charge storage insulating layer formed on the semiconductor substrate, the first gate electrode being formed on the first insulating layer; and
- a select transistor having a second insulating layer and a second gate electrode, the second insulating layer being formed on the semiconductor substrate, the second gate electrode being formed on the second insulating layer,
- wherein the first gate electrode is provided with a first silicide layer of a first width, the second gate electrode is provided with a impurity-doped silicon layer and a second silicide layer of a second width formed on the impurity-doped silicon layer, and the second width is larger than the first width.

2. The device of claim 1:
wherein the second silicide has the same composition as the first silicide.

3. The device of claim 1:
wherein the first gate electrode is fully silisided and the second gate electrode is partially silisided.

* * * * *